(12) United States Patent  
Gonchar

(10) Patent No.: US 12,306,539 B2
(45) Date of Patent: May 20, 2025

(54) OPTICAL ELEMENT, EUV LITHOGRAPHY SYSTEM, AND METHOD FOR FORMING NANOPARTICLES

(71) Applicant: Carl Zeiss SMT GmbH, Oberkochen (DE)

(72) Inventor: Anastasia Gonchar, Ulm (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 214 days.

(21) Appl. No.: 17/986,329

(22) Filed: Nov. 14, 2022

(65) Prior Publication Data

US 2023/0076667 A1 Mar. 9, 2023

Related U.S. Application Data

(63) Continuation of application No. PCT/EP2021/060921, filed on Apr. 27, 2021.

(30) Foreign Application Priority Data

May 14, 2020 (DE) ..................... 10 2020 206 117.3

(51) Int. Cl.
*G03F 7/00* (2006.01)

(52) U.S. Cl.
CPC ........ *G03F 7/7015* (2013.01); *G03F 7/70316* (2013.01)

(58) Field of Classification Search
CPC ............................ G03F 7/7015; G03F 7/70316
See application file for complete search history.

(56) References Cited

U.S. PATENT DOCUMENTS

| 6,664,554 | B2 | 12/2003 | Klebanoff et al. |
| 11,709,299 | B2 * | 7/2023 | Ambur ................... G02B 1/041 |
| | | | 359/581 |
| 11,885,999 | B2 * | 1/2024 | Acharya .............. G02B 5/0242 |
| 2015/0160569 | A1 | 6/2015 | Osorio Oliveros |
| 2016/0223896 | A1 | 8/2016 | Sun et al. |

(Continued)

FOREIGN PATENT DOCUMENTS

| DE | 102019212910 A1 | 3/2021 |
| EP | 1364231 B1 | 7/2002 |

(Continued)

OTHER PUBLICATIONS

International Preliminary Report on Patentability, PCT/EP2021/060921, Nov. 15, 2022, 9 pages.

(Continued)

*Primary Examiner* — Hung V Nguyen
(74) *Attorney, Agent, or Firm* — Edell, Shapiro & Finnan, LLC

(57) ABSTRACT

An optical element (1) includes: a substrate (2), applied to the substrate (2), a multilayer system (3) which reflects EUV radiation (4), and applied to the multilayer system (3), a protective layer system (5) having an uppermost layer (5a). Nanoparticles (7) are embedded into the material of the uppermost layer (5a) of the protective layer system (5) which nanoparticles contain at least one metallic material. An EUV lithography system which includes at least one such optical element (1) designed as indicated above, and a method of forming nanoparticles (7) in the uppermost layer (5a) of the protective layer system (5) are also disclosed.

19 Claims, 2 Drawing Sheets

(56) References Cited

U.S. PATENT DOCUMENTS

2018/0031965 A1    2/2018    Jindal
2019/0049634 A1*    2/2019    Jaiswal ................ G02B 5/0891

FOREIGN PATENT DOCUMENTS

| | | |
|---|---|---|
| EP | 1522895 B1 | 11/2006 |
| EP | 1065568 B1 | 9/2007 |
| EP | 1402542 B1 | 9/2007 |
| JP | 2006080478 A | 3/2006 |
| JP | 4352977 B2 | 10/2009 |
| WO | 2013124224 A1 | 8/2013 |
| WO | 2014124769 A1 | 8/2014 |
| WO | 2014139694 A1 | 9/2014 |
| WO | 2021037515 A1 | 3/2021 |

OTHER PUBLICATIONS

German Office Action with English translation, Application No. 10 2020 206 117.3, Nov. 9, 2020, 5 pages.

Zubkov et al.: "X-Ray Photoelectron Spectroscopy of Stabilized Zirconia Films with Embedded Au Nanoparticles Formed under Irradiation with Gold Ions" (2018), Low Dimensional Systems, vol. 60, No. 3, pp. 598-602.

Hunt et al., "Ion Implantation-induced Nanoscale Particle Formation in Al2O3 and SiO2 via Reduction" Acta mater. vol. 47, No. 5, (1999), pp. 1497-1511.

Du et al.: "Enhanced light absorption of TiO2 in the near-ultraviolet band by Aunanoparticles" Optics Letters, vol. 35, No. 20, Oct. 15, 2010, 3 pages.

Stepanov, "Applications of Ion Implantation for Modification of TiO2: A review", Rev. Adv. Mater. Sci. 30 (2012), pp. 150-165.

International Search Report, PCT/EP2021/060921, Jul. 20, 2021, 5 pages.

* cited by examiner

OPTICAL ELEMENT, EUV LITHOGRAPHY SYSTEM, AND METHOD FOR FORMING NANOPARTICLES

CROSS-REFERENCE TO RELATED APPLICATION

This is a Continuation of International Application PCT/EP2021/060921, which has an international filing date of Apr. 27, 2021, and the disclosure of which is incorporated in its entirety into the present Continuation by reference. This Continuation also claims foreign priority under 35 U.S.C. § 119 (a)-(d) to and also incorporates by reference, in its entirety, German Patent Application DE 10 2020 206 117.3 filed on May 14, 2020.

FIELD OF THE INVENTION

The invention relates to an optical element comprising: a substrate, an EUV radiation-reflecting multilayer system applied to the substrate, and a protective layer system that is applied to the multilayer system and has an uppermost layer. The invention also relates to an EUV lithography system which comprises at least one such optical element. The invention also relates to a method of forming nanoparticles embedded into the uppermost layer of the protective layer system of the optical element.

BACKGROUND

For the purposes of this application, an EUV ("extreme ultraviolet") lithography system is understood as meaning an optical system or an optical arrangement for EUV lithography, i.e. an optical system that can be used in the field of EUV lithography. Apart from an EUV lithography apparatus used for producing semiconductor components, the optical system can be for example an inspection system for the inspection of a photomask (hereinafter also referred to as a reticle) used in an EUV lithography apparatus, for the inspection of a semiconductor substrate to be structured (hereinafter also referred to as a wafer), or a metrology system used for measuring an EUV lithography apparatus or parts thereof, for example for measuring a projection system.

EUV radiation is understood to mean radiation in a wavelength range of between about 5 nm and about 30 nm, for example at 13.5 nm. Since EUV radiation is greatly absorbed by most known materials, the EUV radiation is typically guided through the EUV lithography system with the aid of reflective optical elements.

The layers of a reflective multilayer system in the form of a coating on a reflective optical element (EUV mirror) are subject to harsh conditions in operation in an EUV lithography system, in particular in an EUV lithography apparatus: For example, EUV radiation having a high radiant power impinges on the layers. The EUV radiation also has the effect that some of the EUV mirrors heat up to high temperatures of possibly several 100° C. The residual gases in a vacuum environment in which the EUV mirrors are generally operated may also impair the layers of the reflective multilayer system in the form of the coating, particularly if said gases are converted into reactive species such as ions or radicals by the effect of the EUV radiation. The ventilation of the vacuum environment in a pause in operation, and unwanted leaks that occur, can also lead to damage to the layers of the reflective multilayer system. In addition, the layers of the reflective multilayer system may be contaminated or damaged by hydrocarbons arising during operation, by volatile hydrides, by drops of tin or tin ions, by cleaning media, etc.

In order to protect the layers of the reflective multilayer system of the optical element, a protective layer system is employed which is applied to the multilayer system and which may itself comprise one or more layers. The layers of the protective layer system may fulfill different functions in order to prevent typical damage scenarios; for example, the formation of bubbles or the detachment of layers (delamination), in particular as a result of a plasma present in the residual gas atmosphere, which, as well as reactive hydrogen, also contains other gas constituents, for example reactive oxygen, water, nitrogen, noble gases and hydrocarbons. The protective layer system can also protect the multilayer system from the effects of the EUV radiation or from thermal influences. Surface processes, for example oxidation/reduction cycles, take place at the surface of the uppermost layer of the protective layer system and not in the multilayer system itself.

WO 2014/139694 A1 describes an optical element in which the protective layer system comprises at least one first and one second layer, where the first layer is disposed closer to the multilayer system than the second layer. The first layer may have a lower solubility for hydrogen than the second layer. The protective layer system may comprise a third, uppermost layer, formed of a material having a high recombination rate for hydrogen. The first layer, the second layer and/or the third layer may be formed of a metal or metal oxide. The material of the third, uppermost layer may be selected from the group comprising: Mo, Ru, Cu, Ni, Fe, Pd, V, Nb and their oxides.

EP 1 065 568 B1 describes a lithographic projection device which comprises a reflector having a multilayer reflective coating and having a capping layer. The capping layer may have a thickness of between 0.5 nm and 10 nm. The capping layer may comprise two or three layers of different materials. The uppermost layer may consist of Ru or Rh, the second layer of $B_4C$, BN, diamond-like carbon, $Si_3N_4$ or SiC. The material of the third layer matches the material of a layer of the multilayer reflective coating, and for example may be Mo.

A reflective optical element having a protective layer system which comprises two layers has been disclosed by EP 1 402 542 B1. The protective layer system described therein has an uppermost layer made of a material which resists oxidation and corrosion, e.g. Ru, Zr, Rh, Pd. The second layer serves as a barrier layer which consists of $B_4C$ or Mo and which is intended to prevent the material of the uppermost layer of the protective layer system from diffusing into the uppermost layer of the multilayer system which reflects EUV radiation.

EP 1 364 231 B1 and U.S. Pat. No. 6,664,554 B2 disclose providing a self-cleaning optical element in an EUV lithography system, said optical element having a catalytic capping layer composed of Ru or Rh, Pd, Ir, Pt, Au for protecting a reflective coating against oxidation. A metallic layer composed of Cr, Mo or Ti may be introduced between the capping layer and the surface of the mirror.

EP 1 522 895 B1 has disclosed a method and an apparatus in which at least one mirror is provided with a dynamic protective layer in order to protect the mirror against etching by ions. The method comprises feeding a gaseous substance (as and when necessary) into a chamber containing the at least one mirror. The gas is typically a gaseous hydrocarbon (CxHY). The protective effect of the carbon layer deposited in this way is limited, however, and the feeding and also the monitoring of the mirror necessitate a high outlay.

Other protective layer systems which are or may be formed of a plurality of layers are described in JP2006080478 A and also in JP4352977 B2.

An optical element configured as described at the outset has also been disclosed by WO 2013/124224 A1. The optical element comprises a protective layer system having an uppermost layer and also having at least one further layer under the uppermost layer, the thickness of which is greater than the thickness of the uppermost layer. The material of the uppermost layer is selected from the group of chemical compounds comprising: oxides, carbides, nitrides, silicates and borides.

DE 10 2019 212 910.2 describes an optical element having a protective layer system having a first layer, a second layer and a third, especially uppermost, layer. Metallic particles and/or ions may be implanted into at least one layer of the protective layer system. The ions may be metal ions, for example precious metal ions, especially platinum metal ions, or noble gas ions. The implanted ions are intended to prevent implantation into the material of the respective layer of Sn ions that are formed in the generation of the EUV radiation in an EUV radiation source. The precious metal ions too can serve as hydrogen and/or oxygen blockers. At least one layer of the protective layer system may be doped with metallic (nano) particles, for example with (foreign) atoms in the form of precious metal particles.

SUMMARY

It is an object of the invention to provide an optical element and an EUV lithography system in which damage to the protective layer system is prevented or at least retarded, thus extending the lifetime of the optical element.

According to one formulation of the invention, this object is achieved by an optical element of the type specified at the outset, in which nanoparticles are embedded into the material of the uppermost layer of the protective layer system which preferably contain at least one metallic material. The formation of the embedded nanoparticles is typically induced by ion implantation. The material of the embedded nanoparticles does not necessarily correspond to the material of the ions with which the uppermost layer is irradiated for formation of the nanoparticles. The nanoparticles are also not particles introduced into the material of the uppermost layer by doping. It has been found that the embedded nanoparticles can stabilize the uppermost layer of the protective layer system or the entire protective layer system with respect to the damage factors described above.

In one embodiment, the nanoparticles contain at least one material that does not correspond to the material of the uppermost layer that surrounds the nanoparticles. In this case, the embedded nanoparticles consist of the material of the ions used in the ion implantation, or the nanoparticles contain the material from which the ions used in the irradiation have been formed. This mode of formation of embedded nanoparticles in the form of gold particles or nanoclusters embedded into yttrium-doped zirconium dioxide is described in the article "X-Ray Photoelectron Spectroscopy of Stabilized Zirconia Films with Embedded Au Nanoparticles Formed under Irradiation with Gold Ions", S. Yu. Zubkov et al., Physics of the Solid State 2018, Vol. 60, No. 3, pp. 598-602.

In a further embodiment, the nanoparticles contain at least one material present in the material of the uppermost layer that surrounds the nanoparticles. In this case, the implantation of ions can induce, for example, a reduction of the (base) material of the uppermost layer or of a typically metallic constituent of the material of the uppermost layer. Examples of embedded nanoparticles that are created in this way are described, for example, in the article "Ion Implantation-induced Nanoscale Particle Formation in $Al_2O_3$ and $SiO_2$ via Reduction", E. M. Hunt et al., Acta mater., Vol. 47, No. 5, pages 1497-1511, 1999.

The article by E. M. Hunt states, for example, that it is possible by implantation of ions selected according to thermodynamic laws, e.g. $Y^+$, $Ca^+$, $Mg^+$ or $Zr^+$, to reduce monocrystalline aluminum oxide ($Al_2O_3$) to Al or quartz glass ($SiO_2$) to Si. The Al or Si formed in the reduction can subsequently form clusters and react with other elements in order to form nanodimensional deposits. The implantation of $Y^+$ or $Ca^+$ into $Al_2O_3$ forms Al nanoparticles having average diameters of 12.5 nm or 8.0 nm. The implantation of $Mg^+$ into $Al_2O_3$ forms $MgAl_2O_4$ platelets. The implantation of $Zr^+$ into quartz glass leads to formation of $ZrSi_2$ particles having a size between about 1 nm and about 17 nm.

In a further embodiment, the nanoparticles have average particle sizes between 0.5 nm and 2 nm. The average particle size of the nanoparticles can be determined, for example, in the manner described in the above-cited article by S. Yu. Zubkov et al., i.e. by recording photoelectron spectra; cf. section 3.2 "Determination of the Average Diameter of Gold Clusters in the YSZ Matrix". It will be apparent that the average particle size must not be greater than the thickness of the uppermost layer of the protective layer system. The average particle size and the material of the nanoparticles can optionally be fixed depending on a function of the nanoparticles that goes beyond stabilization of the first layer, as described hereinafter.

In a further embodiment, the nanoparticles reduce the reflectivity of the uppermost layer for radiation at greater wavelengths than EUV radiation, in particular for radiation in the VUV wavelength region or in the DUV wavelength region. The embedded nanoparticles can reduce the reflectivity of the optical element for radiation having wavelengths outside the EUV wavelength range compared to an optical element of identical construction without nanoparticles embedded into the uppermost layer. The radiation outside the EUV wavelength range may in particular be radiation in the VUV wavelength range, i.e. at wavelengths between 100 nm and 200 nm (VUV wavelength range according to DIN 5031 Part 7) or in the DUV wavelength range within an interval between 100 nm and 300 nm. The absorption of radiation, in particular in the DUV/VUV wavelength range, is favorable since the EUV radiation source generally generates radiation in this wavelength range in addition to EUV radiation, and the propagation thereof by the EUV lithography system is undesirable.

The reflectivity of the optical element for the radiation outside the EUV wavelength range is typically generated by the enhanced absorption of the first layer for radiation within this wavelength range. The absorption of the uppermost layer or of the embedded nanoparticles for radiation outside the EUV wavelength range depends not only on the material of the nanoparticles, but also on other parameters, for example on the (average) particle size of the nanoparticles.

As described in the article "Enhanced light absorption of $TiO_2$ in the near-ultraviolet band by Au nanoparticles", Shu-Ya Du et al., Optics Letters, Vol. 35, No. 20, October 2010, the arrangement of Au nanoparticles alongside $TiO_2$ nanoparticles (in rutile phase) can increase the absorption of the $TiO_2$ nanoparticles for radiation in the near-UV wavelength range. Correspondingly, it is also possible by the implantation of Ag ions into $TiO_2$ to increase absorption at wavelengths in the UV/vis wavelength range, as described, for example, in the article "Applications of Ion Implantation for Modification of $TiO_2$: A review", A. L. Stepanov, Rev. Adv. Mater. Sci. 30 (2012), 150-165.

All four articles cited above are incorporated into this application in their entirety by reference.

In a further embodiment, the material of the nanoparticles is selected from the group comprising: Ru, Pd, Pt, Rh, Ir, Au, Ag, Al, Ta, Cr, Mo, Zr, Y, Sc, Ti, V, Nb, La, W. As described above, the absorptive effect of the embedded nanoparticles for radiation outside the EUV wavelength range depends on the material of the nanoparticles. The choice of a suitable material for the nanoparticles depends not only on the boosting effect on the absorption of the "out-of-band" radiation but also on the effect thereof on the stability of the material of the uppermost layer in operation in the EUV lithography system. The choice of material of the nanoparticles typically additionally also depends on the (base) material of the uppermost layer into which the nanoparticles are embedded.

In a further embodiment, the uppermost layer has a thickness of between 1.0 nm and 5.0 nm. For the embedding of the nanoparticles, a minimum thickness of the uppermost layer is required, which is typically 1.0 nm. Given a suitable choice of materials of the individual layer(s) (see below) and given a suitable design of the protective layer system, it is possible even in the case of a comparatively low thickness of the individual layer(s) to ensure sufficient protective action and hence a long lifetime of the optical element. The comparatively low thickness of the layer(s) of the protective layer system leads in general to a reduction in the absorption of the EUV radiation passing through the protective layer system, thereby increasing the reflectivity of the reflective optical element.

In a further embodiment, the protective layer system has at least one further layer disposed between the uppermost layer and the multilayer system. As described above, the protective layer system may consist solely of the uppermost layer, but it is also possible that further layers disposed beneath the uppermost layer can serve, for example, to block the passage of hydrogen/oxygen ions to the multilayer system or as barrier for prevention of mixing of the material of the uppermost layer of the protective layer system with the material of the uppermost layer of the multilayer system (e.g. Si).

In one development, the (or each) further layer has a thickness between 0.1 nm and 5.0 nm. There are generally no nanoparticles embedded in the further layer(s), such that this/these layer(s) can have a very low thickness, which contributes to a reduction in the absorptive effect of this/these layer(s).

In a further embodiment, the material of the uppermost layer into which the nanoparticles are embedded and/or the material of at least one further layer is/are formed from a stoichiometric or nonstoichiometric oxide or from a stoichiometric or nonstoichiometric mixed oxide. The oxide or mixed oxide may be a stoichiometric oxide or mixed oxide or may be a nonstoichiometric oxide or mixed oxide. Mixed oxides are composed of a plurality of oxides, meaning that their crystal lattice is made up of oxygen ions and the cations of a plurality of chemical elements. The use of oxides in the layers of the protective layer system has been found to be favorable since these have high absorption for DUV radiation, which can be additionally boosted by the embedded nanoparticles in the case of the uppermost layer.

In one development, the oxide or mixed oxide contains at least one chemical element selected from the group comprising: Zr, Ti, Nb, Y, Hf, Ce, La, Ta, Al, W, Cr.

In order to prevent degradation of the layers in the multilayer system and/or to counteract any reduction in reflectivity, the material of the uppermost layer and—if present—of the further layer(s) should be stable with respect to cleaning media (aqueous, acidic, basic, organic solvents and surfactants), and also to reactive hydrogen (H*), i.e. hydrogen ions and/or hydrogen radicals, which are used in the cleaning of the surface of the protective layer system or of the uppermost layer.

If the optical element is arranged in the vicinity of the EUV radiation source, the material of the uppermost layer should be resistant to Sn and/or not mix with Sn. In particular, it should be possible to remove Sn contaminations deposited on the uppermost layer from the surface of the third layer using reactive hydrogen (H*). The material of the uppermost layer should also be resistant to redox reactions, in other words neither oxidize nor be reduced-on contact with hydrogen, for example. The uppermost layer should also not contain any substances which are volatile in an atmosphere containing oxygen and/or hydrogen. The oxides and mixed oxides of the metals described above meet these conditions or a majority of these conditions.

In a further embodiment, the further layer or at least one of the further layers is formed of at least one metal (or of a mixture of metals, or of an alloy). In contrast to the uppermost layer, which is formed preferably of an oxide or of a mixed oxide, the further layer(s) may be formed of (at least) one metal. The requirements with regard to resistance to cleaning media etc. are less stringent for the further layer(s) than for the uppermost layer.

In a development of this embodiment, the or at least one further layer comprises or consists of a metal selected from the group comprising: Ru, Pd, Pt, Rh, Ir, Al, Ta, Cr, Mo, Zr, Y, Sc, Ti, V, Nb, La and mixtures thereof. These metallic materials are likewise good at meeting the requirements described earlier above for the material of the uppermost layer.

In a further embodiment, the material of the further layer is selected from the group consisting essentially of: C, $B_4C$, BN, Si. With regard in particular to their properties as diffusion barrier layers, these materials have been found to be useful for preventing diffusion of the material of the uppermost layer of the multilayer system into the protective layer system.

In a further embodiment, the protective layer system has a thickness of less than 10 nm, preferably of less than 7 nm. As described above, given a suitable choice of materials of the individual layer(s) and given a suitable design of the protective layer system, it is possible even in the case of a comparatively low thickness of the individual layer(s) to ensure sufficient protective action and hence a long lifetime of the optical element. The comparatively low thickness of the layers of the laminar layer system additionally leads in general to a reduction in the absorption of the EUV radiation passing through the protective layer system, thereby increasing the reflectivity of the reflective optical element. It will be appreciated that the materials selected for the layers of the protective layer system should be materials which do not have too great an absorption for EUV radiation.

The selection of suitable materials for the uppermost layer and for the further layer(s) requires harmonization in relation to their properties; in particular, the lattice constants, the coefficient of thermal expansion (CTE) and the free surface energies of the materials of the layers should be harmonized with one another. Not every combination of the materials described above, therefore, is equally suitable for producing the protective layer system.

The layers of the protective layer system and also the layers of the reflective multilayer system may be applied in particular by a PVD (physical vapor deposition) coating process or by a CVD (chemical vapor deposition) coating process. The PVD coating process may, for example, comprise electron beam vapor deposition, magnetron sputtering, or laser beam vapor deposition ("pulsed laser deposition", PLD). The CVD coating process may be, for example, a plasma-enhanced CVD process (PE-CVD) or an atomic layer deposition (ALD) process. Atomic layer deposition, in particular, enables very thin layers to be deposited.

In another embodiment, the optical element takes the form of a collector mirror. In EUV lithography, collector mirrors are typically used as the first mirror after the EUV radiation source, downstream of a plasma radiation source, for example, in order to collect the radiation emitted in different directions by the radiation source and to reflect it in a bundled format to the next mirror on. Owing to the high radiative intensity in the environment of the radiation source, molecular hydrogen that is present there with particularly high probability in the residual gas atmosphere can be converted into reactive (atomic and/or ionic) hydrogen with high kinetic energy, and therefore collector mirrors specifically are at particular risk, owing to penetration by reactive hydrogen, of exhibiting delamination phenomena at the layers of the protective layer system and/or at the upper layers of their multilayer system.

A further aspect of the invention relates to an EUV lithography system comprising: at least one optical element as described earlier on above. The EUV lithography system can be an EUV lithography apparatus for exposing a wafer, or can be some other optical arrangement that uses EUV radiation, for example an EUV inspection system, for example for inspecting masks, wafers or the like that are used in EUV lithography.

A further aspect of the invention relates to a method of forming nanoparticles embedded into an uppermost layer of a protective layer system of an optical element configured as described above, said method comprising: forming the embedded nanoparticles by irradiating the uppermost layer of the protective layer system with ions. As described above, the nanoparticles are formed by irradiation with ions in the uppermost layer. The nanoparticles may be the implanted ions. It is alternatively possible that the nanoparticles contain a material or consist of a material which is present in the uppermost layer and which does not correspond to the material of the ions used in the irradiation.

The ion dose required in the irradiation is typically in the order of magnitude between about $10^{15}$ ions/cm$^2$ or about $10^{16}$ ions/cm$^2$ and about $10^{17}$ ions/cm$^2$. Typical ion energies in the implantation are in the order of magnitude of about 100-200 keV.

Further features and advantages of the invention will be apparent from the description of working examples of the invention that follows, with reference to the figures of the drawing, which show details essential to the invention, and from the claims. The individual features can each be implemented alone or in a plurality in any combination in one variant of the invention.

BRIEF DESCRIPTION OF THE DRAWINGS

Working examples are shown in the schematic drawing and are detailed in the description that follows. The figures show.

DETAILED DESCRIPTION

In the following description of the drawings, identical reference signs are used for identical or functionally identical components.

Figure 1A:
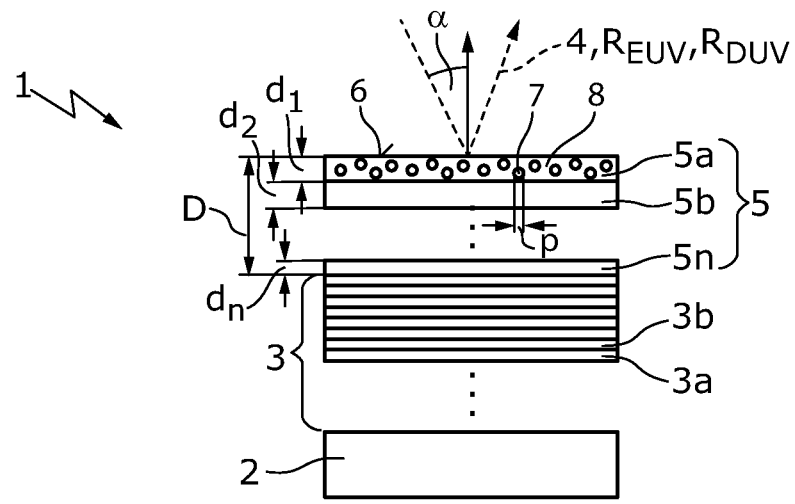
FIG. 1A and FIG. 1B schematic diagrams of an optical element in the form of an EUV mirror having a reflective multilayer system and a protective layer system with an uppermost layer into which nanoparticles are being (FIG. 1A)/have been (FIG. 1B) embedded, and FIG. 2 a schematic representation of an EUV lithography apparatus.
Figure 1B:
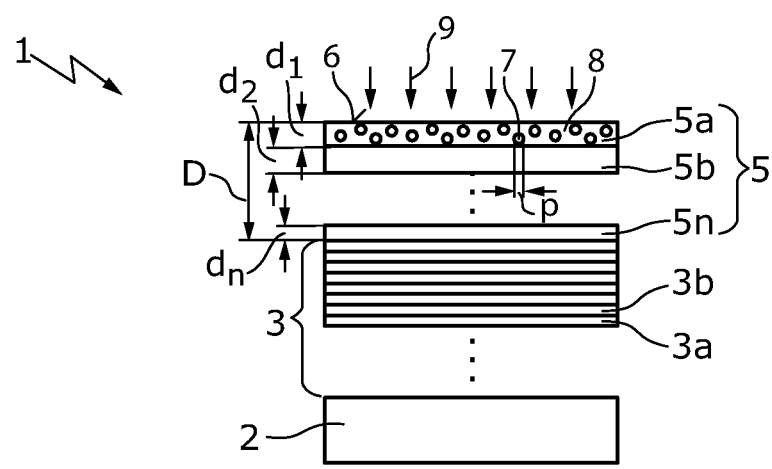

FIG. 1A and FIG. 1B show a schematic of the construction of an optical element 1 which comprises a substrate 2 composed of a material having a low coefficient of thermal expansion, for example of Zerodur®, ULE® or Clearceram®. The optical element 1 shown in FIGS. 1A, 1B is configured for reflection of EUV radiation 4 incident on the optical element 1 with normal incidence, i.e. at angles α of incidence of typically less than about 45° with respect to the surface normal. For the reflection of EUV radiation 4, a reflective multilayer system 3 is applied to the substrate 2. The multilayer system 3 comprises alternately applied layers of a material having a comparatively high real part of the refractive index at the operating wavelength (also called "spacer" 3b) and of a material having a comparatively low real part of the refractive index at the operating wavelength (also called "absorber" 3a), where an absorber-spacer pair forms a stack. As a result of this construction of the multilayer system 3, a crystal is simulated, to a certain degree, with lattice planes corresponding to the absorber layers at which Bragg reflection takes place. In order to ensure sufficient reflectivity, the multilayer system 3 comprises a number of generally more than fifty alternating layers 3a, 3b.

The thicknesses of the individual layers 3a, 3b and also of the repeating stacks can be constant over the entire multilayer system 3 or else vary, depending on what spectral or angle-dependent reflection profile is intended to be achieved. The reflection profile can also be influenced in a targeted manner by the basic structure composed of absorber 3a and spacer 3b being supplemented by additional more and less absorbing materials in order to increase the possible maximum reflectivity at the respective operating wavelength. To that end, in some stacks absorber and/or spacer materials can be mutually interchanged, or the stacks can be constructed from more than one absorber and/or spacer material. The absorber and spacer materials can have constant or varying thicknesses over all the stacks in order to optimize the reflectivity. Furthermore, it is also possible to provide additional layers for example as diffusion barriers between spacer and absorber layers 3a, 3b.

In the present example, in which the optical element 1 has been optimized for an operating wavelength of 13.5 nm, in other words for an optical element 1 which exhibits maximum reflectivity at a wavelength of 13.5 nm under substantially normal incidence of EUV radiation 4, the stacks of the multilayer system 3 comprise alternating silicon layers 3a and molybdenum layers 3b. In this system, the silicon layers 3b correspond to the layers having a comparatively high real part of the refractive index at 13.5 nm and the molybdenum layers 3a correspond to the layers having a comparatively low real part of the refractive index at 13.5 nm. Depending on the exact value of the operating wavelength, other material combinations, such as e.g. molybdenum and beryllium, ruthenium and beryllium, or lanthanum and $B_4C$, are likewise possible.

In order to protect the multilayer system 3 from degradation, a protective layer system 5 is applied to the multilayer system 3. In the example shown in FIGS. 1A, B, the protective layer system consists of a number n of layers $5a, \ldots, 5n$, where n typically assumes a value from 1 to 10. The first layer 5a is the furthest removed from the multilayer coating 3 and forms an uppermost layer 5a of the protective layer system 5. A surface 6 formed on the uppermost layer 5a forms an exposed interface with the environment. The further layers $5b, \ldots, 5n$, i.e. the second layer 5b to the nth layer 5n of the protective layer system 5, are arranged closer than the uppermost layer 5a in relation to the multilayer system 3. It is not absolutely necessary for the protective layer system 5 to have the further layers $5b, \ldots, 5n$; instead, the protective layer system 5 may consist solely of a single (uppermost) layer 5a.

The uppermost layer 5a has a first thickness $d_1$ between 1.0 nm and 5.0 nm. The second layer 5b to the nth layer 5n each have a thickness $d_2, \ldots, d_n$ between 0.1 nm and 5.0 nm. The protective layer system 5 has a total thickness D (here: $D=d_1+d_2+\ldots+d_n$) which is less than 10 nm, optionally less than 7 nm.

In the example shown, the material 8 of the uppermost layer 5a is a (stoichiometric or nonstoichiometric) oxide or a (stoichiometric or nonstoichiometric) mixed oxide which comprises at least one chemical element selected from the group comprising: Zr, Ti, Nb, Y, Hf, Ce, La, Ta, Al, W, Cr.

The material of at least one of the second layer 5b to the nth layer 5n may likewise be a (stoichiometric or nonstoichiometric) oxide and/or a (stoichiometric or nonstoichiometric) mixed oxide containing at least one chemical element selected from the above-specified group comprising: Zr, Ti, Nb, Y, Hf, Ce, La, Ta, Al, W, Cr.

Alternatively to an oxide or mixed oxide, the material of at least one of the second to nth layers $5b, \ldots, 5n$ may comprise (at least) one metal. The metal may be selected, for example, from the group comprising: Ru, Pd, Pt, Rh, Ir, Al, Ta, Cr, Mo, Zr, Y, Sc, Ti, V, Nb, La and mixtures thereof.

The material of at least one of the further layers $5b, \ldots, 5n$ may alternatively be selected from the group comprising: C, $B_4C$, BN, Si. These materials have been found to be advantageous as diffusion barriers.

The choice of suitable materials for the second to nth layers $5b, \ldots, 5n$ depends upon factors including the arrangement thereof in the protective layer system 5. For example, it may be favorable to produce the nth layer 5n directly adjoining the reflective multilayer system 3 from a material that forms a diffusion barrier, i.e., for example, from C, $B_4C$, Bn or optionally from Si.

The protective effect of the protective layer system 5 is dependent not only on the materials which are selected for the layers $5a, \ldots, 5n$ but also on whether these materials are a good fit in terms of their properties—for example, with regard to their lattice constants, their coefficients of thermal expansion, their free surface energies, etc.

There follows a description of an example of a protective layer system 5 having three layers 5a, 5b, 5c harmonized with one another in terms of their properties. The first layer 5a is formed of $TiO_x$ and has a thickness $d_1$ of 1.5 nm, the second layer 5b is formed of Ru and has a thickness $d_2$ of 2 nm, and the third layer 5c is formed of $AlO_x$ and likewise has a thickness $d_3$ of 2 nm. It will be appreciated that as well as the example described here, other combinations of materials are also possible, and also the thicknesses of the three (or optionally more or fewer) layers 5a-c of the protective layer system 5 may differ from the values indicated above.

In the examples shown in FIGS. 1A, B, nanoparticles 7 are embedded into the material 8 of the uppermost layer 5a of the protective layer system 5. The nanoparticles 7 in the example shown are metallic nanoparticles. The metal from which the nanoparticles are formed may, for example, be Ru, Pd, Pt, Rh, Ir, Au, Ag, Al, Ta, Cr, Mo, Zr, Y, Sc, Ti, V, Nb, La or W.

As described above, the material 8 of the uppermost layer 5a into which the nanoparticles 7 are embedded is a stoichiometric or nonstoichiometric oxide or a stoichiometric or nonstoichiometric mixed oxide. The nanoparticles 7 embedded into the oxide or mixed oxide 8 increase the stability of the uppermost layer 5a with respect to damage factors, for example EUV radiation 4, elevated temperatures, plasma, and oxidation and reduction processes.

The formation of the embedded nanoparticles 7 is induced by ion implantation, meaning that, for the embedding of the nanoparticles 7, the surface 6 of the uppermost layer 5a of the protective layer system 5 is irradiated with ions 9 in the production of the optical element 1, as shown in FIG. 1B.

In principle, the material of the embedded nanoparticles 7 may correspond to the material of the ions 9 which is used in the ion irradiation of the optical element 1. In this case, the material of the embedded nanoparticles 7 generally comprises foreign atoms, i.e. chemical elements that do not correspond to the material of the uppermost layer 5a surrounding the nanoparticles 8.

In the example shown, the ions 9 that are used for the irradiation are a metallic material, for example a precious metal, in particular gold (Au) or silver (Ag). In the example shown, the material of the uppermost layer 5a surrounding the embedded nanoparticles 7 is titanium dioxide $TiO_2$ or a mixed titanium oxide ($TiO_x$). In this case, the embedded nanoparticles 7 enable not only the stabilization of the uppermost layer 5a against external damage factors but also an increase in the absorption of the uppermost layer 5a for radiation at wavelengths outside the EUV wavelength range, and in this way a reduction in the reflectivity $R_{DUV}$ of the optical element 1 with respect to an optical element 1 of identical construction for this wavelength range, for example the DUV wavelength range between 100 nm and 300 nm, compared to an optical element 1 in which no nanoparticles 7 are embedded in the uppermost layer 5a of the protective layer system 5. The reflectivity $R_{EUV}$ of the optical element 1 for EUV radiation 4, by contrast, is reduced only extremely slightly, if at all, by the embedding of the nanoparticles 7.

Alternatively to the embedding of nanoparticles 7 in the form of foreign atoms into the surrounding material 8 of the uppermost layer 5a as described above, the nanoparticles 7 may contain at least one material present in the surrounding material 8 of the uppermost layer 5a. The nanoparticles 7 here may additionally contain the material of the ions 9 which are used in the irradiation, but it is also possible that the irradiation with the ions 9 leads to formation of nanoparticles 7 formed exclusively from the chemical elements present in the material 8 of the uppermost layer 5a before or without the irradiation with the ions 9.

In particular, the irradiation with the ions 9 can lead to structure formation in which nanoparticles 7 are formed in the material of the uppermost layer 5a in that the oxide or mixed oxide in the uppermost layer 5a is chemically reduced. As described in the article by E. M. Hunt cited above, it is possible, for example, to use ions 9 in the form of $Y^+$, $Ca^+$, $Mg^+$ or $Zr^+$ for irradiation, in order to reduce monocrystalline aluminum oxide ($Al_2O_3$) to Al. The Al formed in the reduction can subsequently form clusters and react with other elements in order to form the embedded Al nanoparticles 7. The implantation of $Mg^+$ into $Al_2O_3$ forms nanoparticles 7 in the form of $MgAl_2O_4$ platelets. In this case, the nanoparticles 7 contain both the material of the ions 9 used in the irradiation and the constituents or chemical elements of the material of the uppermost layer 5a (i.e. $Al_2O_3$) prior to the irradiation. If the material of the uppermost layer 5a is quartz glass ($SiO_2$), irradiation with $Zr^+$ ions 9 can form $ZrSi_2$ nanoparticles 7 in the uppermost layer 5a.

The ion dose required for the above-described formation of nanoparticles 7 is typically in the order of magnitude between about $10^{15}$ ions/cm$^2$ or about $10^{16}$ ions/cm$^2$ and about $10^{17}$ ions/cm$^2$. Typical energies of the ions 9 in the implantation or in the irradiation are in the order of magnitude of about 100-200 keV.

In the cases described above, it has been found to be favorable when the nanoparticles 7 have average particle sizes p between about 0.5 nm and about 2 nm. The average particle size p of the nanoparticles 7 may be adjusted—within certain limits—by suitable selection of the parameters in the irradiation with the ions 9. The average particle size p affects the absorption of the uppermost layer 5a for radiation outside the EUV wavelength range and may be chosen such that particularly strong absorption and hence a reduction in the reflectivity $R_{DUV}$ of the optical element 1 is established within a wavelength range of interest.

It will be appreciated that the uppermost layer 5a, alternatively to the materials described above, may also be formed from different materials, especially in the form of oxides or mixed oxides, into which nanoparticles 7 are embedded in the manner described above.

Figure 2:
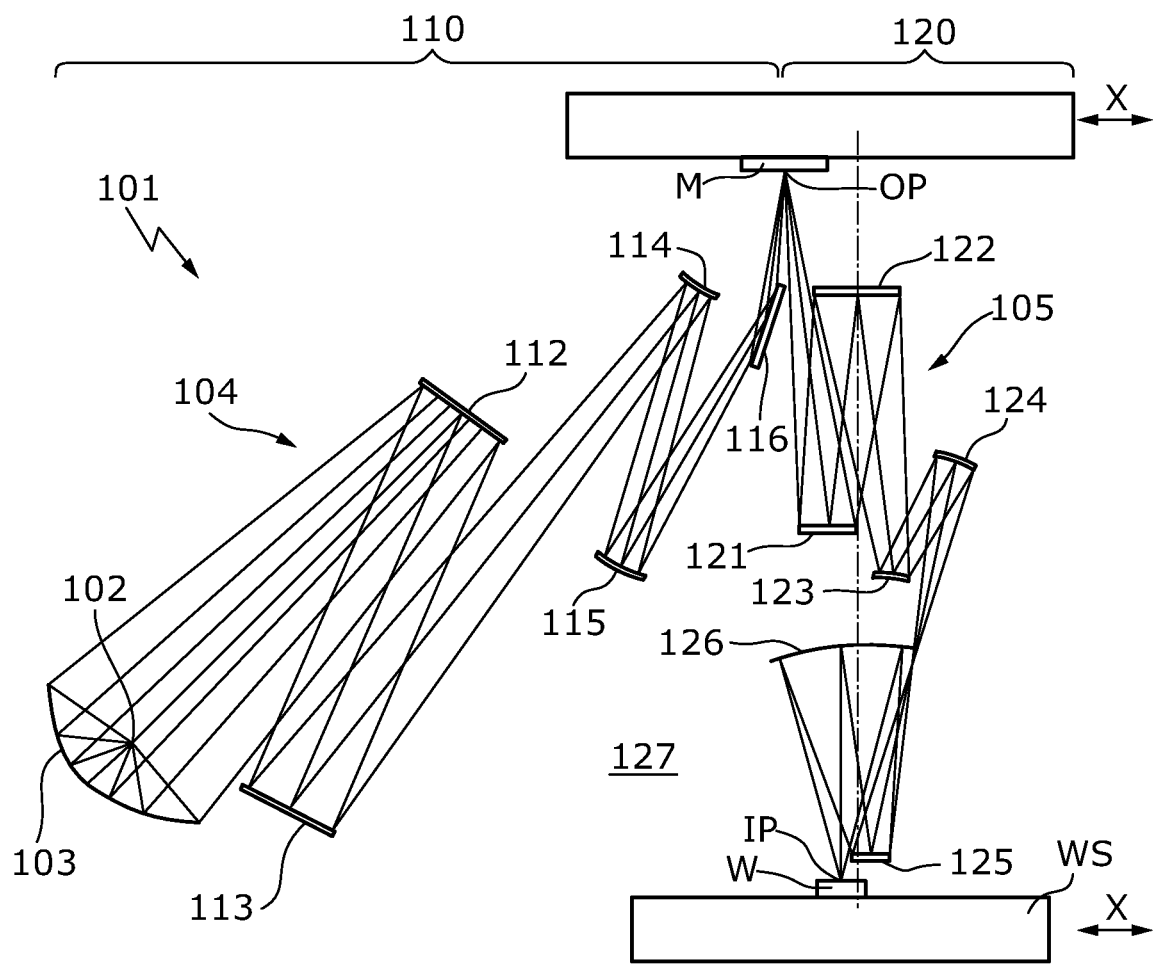

The optical elements 1 illustrated in FIGS. 1A, B can be used in an EUV lithography system in the form of an EUV lithography apparatus 101, as is illustrated schematically below in the form of a so-called wafer scanner in FIG. 2.

The EUV lithography apparatus 101 comprises an EUV light source 102 for generating EUV radiation, which has a high energy density in the EUV wavelength range below 50 nanometers, in particular between about 5 nanometers and about 15 nanometers. The EUV light source 102 can be embodied, for example, in the form of a plasma light source for generating a laser-induced plasma. The EUV lithography apparatus 101 shown in FIG. 2 is designed for an operating wavelength of the EUV radiation of 13.5 nm, for which the optical elements 1 illustrated in FIGS. 1A, B are also designed. However, it is also possible for the EUV lithography apparatus 101 to be configured for a different operating wavelength in the EUV wavelength range, such as 6.8 nm, for example.

The EUV lithography apparatus 101 further comprises a collector mirror 103 in order to focus the EUV radiation of the EUV light source 102 to form a bundled illumination beam 104 and to increase the energy density further in this way. The illumination beam 104 serves to illuminate a structured object M with an illumination system 110, which in the present example has five reflective optical elements 112 to 116 (mirrors).

The structured object M can be for example a reflective photomask, which has reflective and non-reflective, or at least less reflective, regions for producing at least one structure on the object M. Alternatively, the structured object M can be a plurality of micro-mirrors, which are arranged in a one-dimensional or multi-dimensional arrangement and which are optionally movable about at least one axis, in order to set the angle of incidence of the EUV radiation on the respective mirror.

The structured object M reflects part of the illumination beam 104 and shapes a projection beam 105, which carries the information about the structure of the structured object M and is radiated into a projection lens 120, which generates a projected image of the structured object M or of a respective partial region thereof on a substrate W. The substrate W, for example a wafer, comprises a semiconductor material, for example silicon, and is disposed on a mounting, which is also referred to as a wafer stage WS.

In the present example, the projection lens 120 has six reflective optical elements 121 to 126 (mirrors) in order to generate an image of the structure that is present at the structured object M on the wafer W. The number of mirrors in a projection lens 120 typically lies between four and eight; however, as few as two mirrors can also be used, if appropriate.

The reflective optical elements 103, 112 to 116 of the illumination system 110 and the reflective optical elements 121 to 126 of the projection lens 120 are arranged in a vacuum environment 127 during the operation of the EUV lithography apparatus 101. A residual gas atmosphere containing, inter alia, oxygen, hydrogen and nitrogen is formed in the vacuum environment 127.

The optical element 1 illustrated in FIGS. 1A, B can be one of the optical elements 103, 112 to 115 of the illumination system 110 or one of the reflective optical elements 121 to 126 of the projection lens 120 which are designed for normal incidence of the EUV radiation 4. In particular, the optical element 1 of FIGS. 1A, B may be the collector mirror 103, which in the operation of the EUV lithography apparatus 101 is exposed not only to reactive hydrogen but also to Sn contaminations. The protective layer system 5 described in connection with FIGS. 1A, B enables the lifetime of the collector mirror 103 to be significantly extended, and in particular this mirror can be used again after cleaning, for example.

What is claimed is:

1. An optical element, comprising:
   a substrate,
   applied to the substrate, a multilayer system which reflects extreme ultraviolet (EUV) radiation, and
   applied to the multilayer system, a protective layer system having an uppermost layer, wherein nanoparticles containing at least one metallic material are embedded into the uppermost layer of the protective layer system, and wherein the embedded nanoparticles reduce a reflectivity ($R_{VUV}$) of the optical element for radiation at wavelengths greater than wavelengths of the EUV radiation.

2. The optical element as claimed in claim 1, wherein the nanoparticles contain at least one material that is different from a material of the uppermost layer that surrounds the nanoparticles.

3. The optical element as claimed in claim 1, wherein the nanoparticles contain at least one material present in a material of the uppermost layer that surrounds the nanoparticles.

4. The optical element as claimed in claim 1, wherein the nanoparticles have average particle sizes between 0.5 nm and 2 nm.

5. The optical element as claimed in claim 1, wherein the embedded nanoparticles reduce a reflectivity ($R_{VUV}$) of the optical element for radiation in at least one of very ultraviolet (VUV) wavelength regions and deep ultraviolet (DUV) wavelength regions.

6. The optical element as claimed in claim 1, wherein the material of the nanoparticles is selected from the group consisting of at least one of: Ru, Pd, Pt, Rh, Ir, Au, Ag, Al, Ta, Cr, Mo, Zr, Y, Sc, Ti, V, Nb, La, W.

7. The optical element as claimed in claim 1, wherein the uppermost layer has a thickness between 1.0 nm and 5.0 nm.

8. The optical element as claimed in claim 1, wherein the protective layer system comprises at least one further layer disposed between the uppermost layer and the multilayer system.

9. The optical element as claimed in claim 8, wherein the at least one further layer has a thickness between 0.1 nm and 5.0 nm.

10. The optical element as claimed in claim 1, wherein a material of the uppermost layer is formed of a stoichiometric or nonstoichiometric oxide or of a stoichiometric or nonstoichiometric mixed oxide.

11. The optical element as claimed in claim 8, wherein a material of the at least one further layer is formed of a stoichiometric or nonstoichiometric oxide or of a stoichiometric or nonstoichiometric mixed oxide.

12. The optical element as claimed in claim 10, wherein the oxide or mixed oxide comprises at least one chemical element selected from the group consisting of at least one of: Zr, Ti, Nb, Y, Hf, Ce, La, Ta, Al, W, Cr.

13. The optical element as claimed in claim 8, wherein at least one of the further layers is formed from at least one metal.

14. The optical element as claimed in claim 13, wherein at least one of the further layers comprises or consists of a metal selected from the group consisting of at least one of: Ru, Pd, Pt, Rh, Ir, Al, Ta, Cr, Mo, Zr, Y, Sc, Ti, V, Nb, La and mixtures thereof.

15. The optical element as claimed in claim 8, wherein the material of at least one of the further layers is selected from the group consisting of at least one of: C, $B_4C$, BN, Si.

16. The optical element as claimed in claim 1, wherein the protective layer system has a thickness of less than 10 nm.

17. The optical element as claimed in claim 16, wherein the protective layer system has a thickness of less than 7 nm.

18. The optical element as claimed in claim 16, configured as a collector mirror.

19. An EUV lithography system comprising:
an illumination beam source comprising a first optical element and outputting an illumination beam,
an illumination system comprising further optical elements adapting the illumination beam, and
a projection lens comprising additional optical elements projecting the adapted illumination beam as a projected beam into a projected image,
wherein at least one of the first, further and/or additional optical elements is an optical element as claimed in claim 1.

* * * * *

UNITED STATES PATENT AND TRADEMARK OFFICE
CERTIFICATE OF CORRECTION

| | |
|---|---|
| PATENT NO. | : 12,306,539 B2 |
| APPLICATION NO. | : 17/986329 |
| DATED | : May 20, 2025 |
| INVENTOR(S) | : Gonchar |

Page 1 of 1

It is certified that error appears in the above-identified patent and that said Letters Patent is hereby corrected as shown below:

In the Specification

Column 2, Line 67, delete "(CxHY)." and insert -- $(C_XH_Y)$. --.

Column 6, Line 34, delete "the or at least one" and insert -- the, or at least one, --.

Signed and Sealed this
Ninth Day of December, 2025

John A. Squires
*Director of the United States Patent and Trademark Office*